United States Patent
Gray

(10) Patent No.: US 10,021,804 B1
(45) Date of Patent: Jul. 10, 2018

(54) ELECTRONIC EQUIPMENT CABINET

(71) Applicant: T-Mobile USA, Inc., Bellevue, WA (US)

(72) Inventor: Robert Lavoree Gray, Wenatchee, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 0 days.

(21) Appl. No.: 15/395,908

(22) Filed: Dec. 30, 2016

(51) Int. Cl.
| G06F 1/16 | (2006.01) |
| H05K 7/14 | (2006.01) |
| A47B 47/00 | (2006.01) |
| F16L 5/00 | (2006.01) |
| H05K 7/20 | (2006.01) |

(52) U.S. Cl.
CPC .......... *H05K 7/1491* (2013.01); *A47B 47/00* (2013.01); *F16L 5/00* (2013.01); *H05K 7/1497* (2013.01); *H05K 7/20554* (2013.01)

(58) Field of Classification Search
CPC .. H05K 7/1487–7/1489; H05K 7/1491; H05K 7/1492; H05K 7/20736; H05K 7/20745; G06F 1/181
See application file for complete search history.

(56) References Cited

U.S. PATENT DOCUMENTS

| 173,722 A * | 2/1876 | Hayes | E04C 3/08 160/DIG. 7 |
| 2002/0012242 A1* | 1/2002 | Lecinski | H02B 1/202 361/827 |
| 2002/0134567 A1* | 9/2002 | Rasmussen | G06F 1/189 174/50 |
| 2003/0141687 A1* | 7/2003 | Wixted | B62B 3/006 280/47.35 |
| 2003/0193781 A1* | 10/2003 | Mori | H05K 7/1489 361/725 |
| 2003/0223199 A1* | 12/2003 | Smith | G06F 1/181 361/727 |
| 2004/0168818 A1* | 9/2004 | Layden | H02J 7/0031 174/50 |
| 2004/0195944 A1* | 10/2004 | Sugihara | H05K 7/1495 312/283 |
| 2005/0141200 A1* | 6/2005 | Campini | H01L 23/3677 361/704 |
| 2005/0168945 A1* | 8/2005 | Coglitore | H05K 7/20736 361/695 |
| 2005/0257232 A1* | 11/2005 | Hidaka | G11B 33/126 720/654 |

(Continued)

*Primary Examiner* — Adrian S Wilson
(74) *Attorney, Agent, or Firm* — Lee & Hayes, PLLC

(57) ABSTRACT

Enclosures for electronic equipment with improved cable routing, cooling, and labeling. The enclosures can include improved and additional pass-throughs to enable more direct cable routing when compared to convention rack systems. The enclosures can also comprise increased depth to facilitate cable routing and cooling. The enclosures can also include vented front doors to enable the enclosures to be installed in conventional server rooms and to utilize existing cooling systems. In some examples, the enclosures can include top and side pass-throughs to enable shorter cables to connect components in multiple enclosures. The enclosures can include dedicated ground bars to provide improved grounding and reduced electronic noise.

18 Claims, 6 Drawing Sheets

(56) References Cited

U.S. PATENT DOCUMENTS

| | | | | |
|---|---|---|---|---|
| 2005/0259383 | A1* | 11/2005 | Ewing | H02B 1/306 361/622 |
| 2006/0139877 | A1 | 6/2006 | Germagian | H05K 7/20745 361/695 |
| 2006/0193112 | A1* | 8/2006 | Cauthron | G06F 1/181 361/679.02 |
| 2007/0167125 | A1* | 7/2007 | Rasmussen | H05K 7/2079 454/184 |
| 2007/0211439 | A1* | 9/2007 | Shimizu | H05K 7/20563 361/724 |
| 2008/0002364 | A1* | 1/2008 | Campbell | H05K 7/2079 361/699 |
| 2008/0055849 | A1* | 3/2008 | Lee | H05K 7/20572 361/695 |
| 2008/0289873 | A1* | 11/2008 | Herring | H05K 5/0008 174/520 |
| 2009/0147944 | A1* | 6/2009 | McSorley | H05K 7/186 379/454 |
| 2009/0239460 | A1* | 9/2009 | Lucia | H05K 7/20745 454/184 |
| 2011/0096485 | A1* | 4/2011 | Jian | G06F 1/181 361/679.4 |
| 2011/0310550 | A1* | 12/2011 | Xu | G06F 1/20 361/679.33 |
| 2012/0087085 | A1* | 4/2012 | Moore | G06F 1/182 361/679.46 |
| 2012/0134103 | A1* | 5/2012 | Tan | H05K 7/20736 361/679.46 |
| 2012/0206876 | A1* | 8/2012 | Chen | H05K 5/0021 361/679.58 |
| 2013/0063888 | A1* | 3/2013 | Wang | H05K 7/20736 361/679.48 |
| 2013/0083478 | A1* | 4/2013 | Lin | G06F 1/206 361/679.48 |
| 2014/0085807 | A1* | 3/2014 | Ning | G06F 1/20 361/679.47 |
| 2014/0159552 | A1* | 6/2014 | Bravo | H02B 1/308 312/198 |
| 2014/0369653 | A1* | 12/2014 | Leigh | G02B 6/4452 385/92 |
| 2015/0169012 | A1* | 6/2015 | Saez | G06F 1/181 361/679.31 |
| 2017/0164502 | A1* | 6/2017 | Cox | H05K 7/1491 |

\* cited by examiner

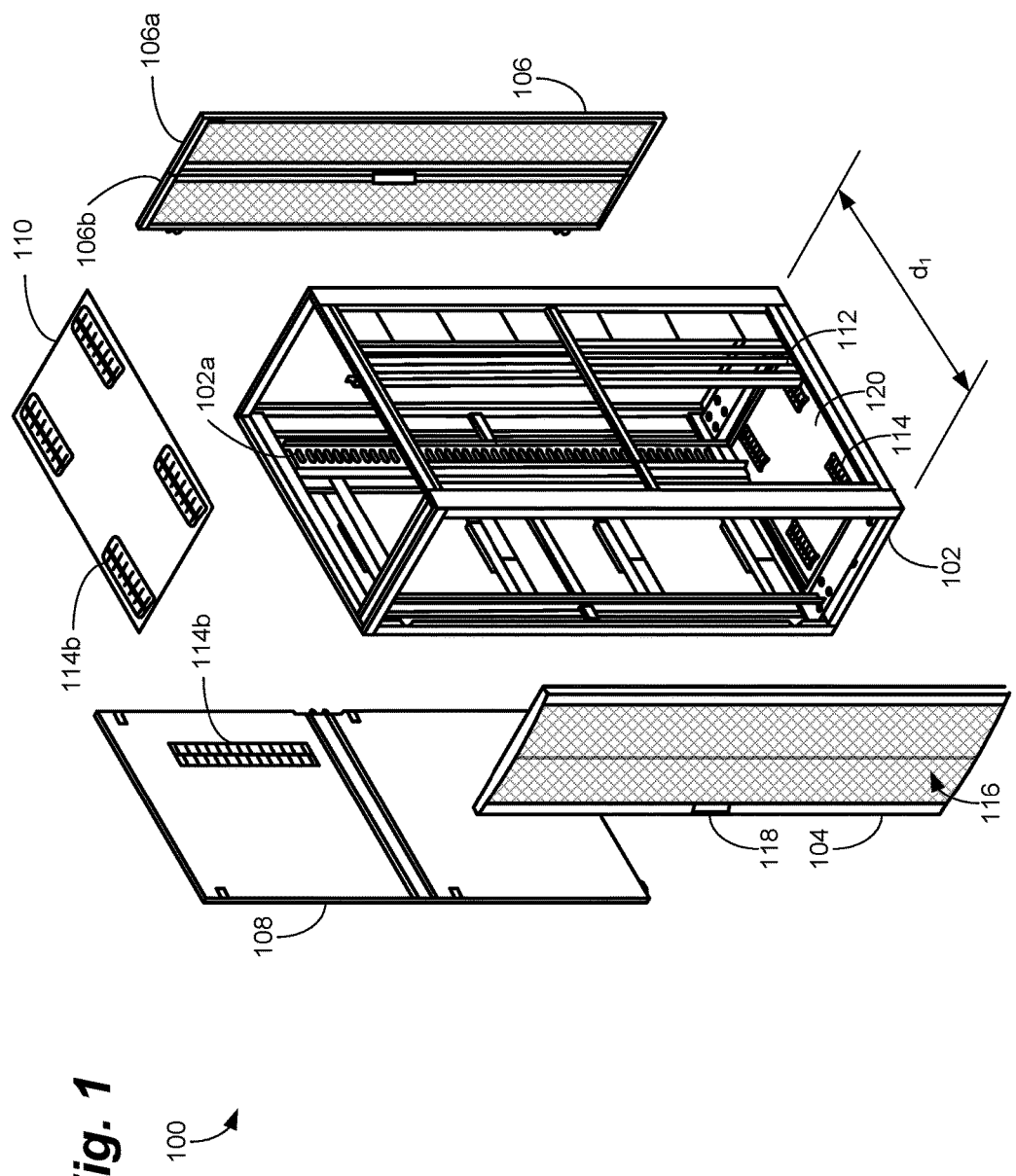

ELECTRONIC EQUIPMENT CABINET

BACKGROUND

The use of computers, and computing power in general, is ubiquitous. Almost every type of business and transaction relies on computers in some way. Indeed, many businesses utilize so much computing power as to justify entire rooms full of computers, sometimes called server rooms. These server rooms can house tens, hundreds, or even thousands of rack style computers, or servers, which are generally networked together to provide combined computing power above that which can be provided by a single computer.

Due to the number of computers, routers, and other electronic devices, server rooms, or rather the components in server rooms, tend to consume large amounts of electricity and generate large amounts of heat. As a result, server rooms tend to have specialized configurations. Server rooms may be fed by very large electrical panels, for example, to provide sufficient power to the multiple computers housed therein. They may also have dedicated generators or battery backup to deal with power outages. They may also have dedicated air conditioning units, floor and ceiling cooling, and other features designed to maintain a reasonable temperature in the server room despite the heat generated by the computers. Indeed, even the cabinets that house the computers are designed to provide easy access for cabling and maintenance and adequate airflow for cooling purposes.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 1 is an exploded view of an improved electronic device cabinet, in accordance with some examples of the present disclosure.

DETAILED DESCRIPTION

Figure 2A:
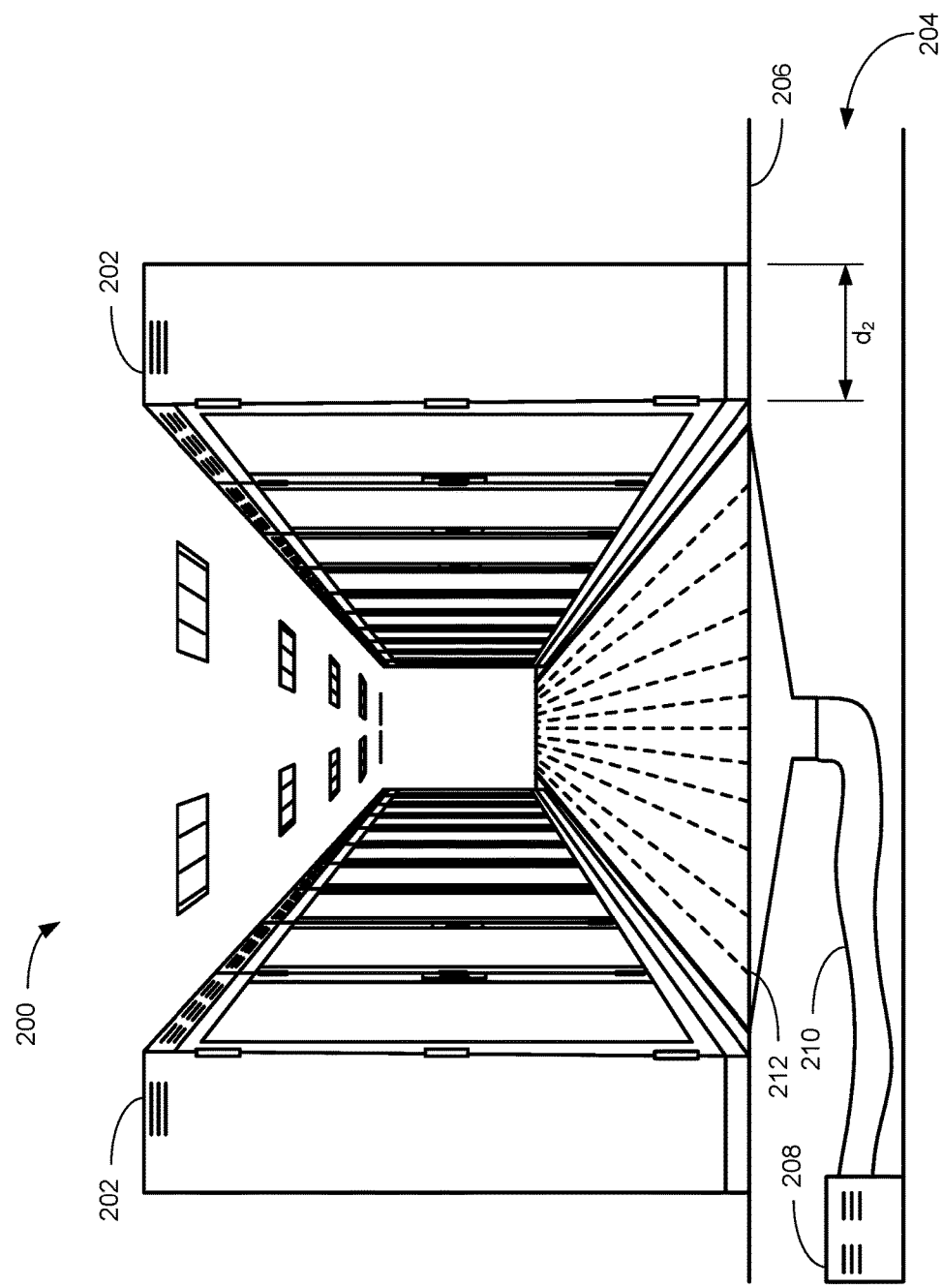
FIG. 2A is a perspective view of a conventional server room 200.

As discussed above, server rooms often contain multiple rack-style computers or servers, routers, modems, power strips, and other electronic equipment. As such, specialized rack-style cabinets exist to enable standardized electronics to be easily installed. Some cabinets include power and communications cable routing and other features.

A problem with conventional cabinets, however, is that they lack the interior volume required to efficiently route cables inside the cabinets. As a result, cables are often bundles tightly together and "crammed" into the cabinets. This can cause connections problems from the cables being over flexed and damaged. This can also cause heat buildup and interference when multiple cables are bundled together with cable ties, for example. Finally, bundling all the cables together and/or forcing them into the cabinet makes diagnosis more difficult. In other words, it is difficult to locate and trace a suspect wire, for example, when it is bundled and tangled with many other wires.

In addition, multiple power and data connections (e.g., network cables) are often made between components in different cabinets. As a result, pass-throughs are sometimes included in the bottom of the enclosure. These pass-throughs enable cables to be routed out the bottom of one cabinet and in the bottom of another cabinet to connect components in different cabinets. Unfortunately, if one, or both, of the components are located in the top of the cabinet (i.e., in a top rack of the rack system), for example, the length of cable required to make the connections can exceed the recommended cable length for a particular type of cable or performance requirement. In other words, longer cables offer more resistance and increase signal travel times, losses, and errors, among other things.

To this end, examples of the present disclosure relate to server cabinets with a number of improved, and additional, features. These cabinets can be larger on the inside, for example, to increase interior volume and improve cable routing. The cabinets can also include one or more pass-throughs in the side and/or top of the cabinet to enable components in different cabinets to be connected with shorter cables. In some examples, the cabinets can also include improved cooling with ventilated doors and other features to compensate for the larger footprint of the cabinet. The cabinets can also include improved grounding and labeling to provide more efficient server room installation and maintenance.

As shown in FIG. 1, examples of the present disclosure can comprise an improved server improved cabinet system 100. As shown, the improved cabinet system 100 can include a main frame 102, a front door panel 104, a rear door panel 106, one or more side panels 108 and a top panel 110, some or all of which can be removable for easier maintenance and shipping (i.e., to enable the cabinet to be flat-packed). In some examples, the improved cabinet system 100 can also include a dedicated ground bar 112 and one or more side 114b and top 114a pass throughs.

As discussed below, in some examples, the depth, $d_1$, of the main frame 102 can be increased to provide additional room for cable routing and other features. So, for example, while a conventional cabinet generally measures 48" deep on the outside, the improved main frame 102 can be deeper. In some examples, the main frame 102 can be 48" deep on the inside. This provides approximately an additional 4" of interior space in the improved cabinet system 100 making the exterior of the main frame 102 greater than 48" deep (e.g., 48-52"). This additional space, in turn, enables cables to be more easily routed, additional cable troughs, and increase spacing between the cables and the electronic components (e.g., servers, routers, etc.).

As in a conventional server rack, the main frame 102 can include a plurality of rack units, or RUs 102a. Each RU 102a is configured to accept one or more rack-mount electronic components. These can include purpose-built servers, router, and other equipment, which generally include integral rack-mounting brackets compatible with standard RUs 102a. This can also include components with added RU 102a brackets, or other parts, to enable them to be mounted to standard RUs 102*a*. The RUs 102*a* offer an easy and convenient means for mounting multiple (generally up to 48) electronic components in a single improved cabinet system 100.

This additional space results in decreased cable density, electronic interference, and heat buildup, among other things. The additional space can also enable the cooling fans and other cooling system components located on the electronic components inside the cabinet, for example, to cool more effectively. In other words, rather than blowing on a "curtain" of cables, which can impede airflow, the airflow from the electronic components can more readily escape the improved cabinet system 100, improving cooling.

In some examples, the front door panel 104 can include a screen 116 to enable cooling air into the improved cabinet system 100. The front door panel 104 can also include a latch 118. In some examples, the latch 118 can be keyed to provide additional security. In other examples, such as in server rooms that are themselves secured, the latch 118 can be a simple mechanical or magnetic catch. In this manner, technicians do not need a key to access the improved cabinet system 100 for maintenance. In some examples, as discussed below with reference to FIGS. 2A-3, the front door panel 104 can also include a vent in the bottom of the door (not shown) to improve cooling.

In some examples, the rear door panel 106 can include one or more vented panels 106*a*, 106*b* hingedly coupled to the main frame 102. The rear door panel 106 can provide access to the rear of the main frame 102. This can enable technicians to access the rear of the electronic components, which generally includes the communications and power cabling, among other things.

The improved cabinet system 100 can also include one or more side panels 108 and a top panel 110. One or both of the side panel 108 and top panel 110 can also include one or more pass-throughs 114. Pass-throughs can comprise apertures in the improved cabinet system 100 to enable cables to pass from one cabinet to another. This can enable multiple computers, routers, and other components to be connected with network cables, for example.

As discussed above, conventional cabinets either have not pass-throughs, or only have pass-throughs 114 on the bottom panel 120. Unfortunately, when a component on the top of one rack needs to be connected to a component on the top of another rack, this requires cables that exceed the recommended length. Excessive long cables can data loss, reductions in transmission speed, interference, and other issues.

To this end, the improved cabinet system 100 can include one or more additional pass-throughs 114. The improved cabinet system 100 can include one or more pass-throughs 114*a* in the side panels 108 and one or more side pass throughs 114*b* in the top panel 110. In this manner, components located near the top of the improved cabinet system 100 can be connected using the top pass throughs 114*a*. Components located in similar locations in the improved cabinet system 100 (i.e., whether they are both relatively high, medium, or low in the rack), on the other hand can be connected using a side pass-through 114*a*. In either case, the components can be connected using shorter cables and more direct routing, which may be required to meet certain performance and reliability targets, for example. So, for example, two components located in a top location (e.g., within 5 RAs 102*s* from the top of the main frame 102) in each improved cabinet system 100 can be connected through the top panels 110 with a significantly shorter cable than if they were connected with pass-throughs 114 in the bottom panel 120.

In any situation involving electronic equipment and indeed, electrical power in general, proper grounding is an important consideration. Many problems with electrical and electronic components can be traced to faulty ground and/or neutral connections. To this end, in some examples, the improved cabinet system 100 can also comprise a dedicated ground bar 112. The ground bar 112 can be mounted inside the main frame 102 proximate the RUs 102*a*. This can enable the electronic components mounted in the improved cabinet system 100 to be grounded via the mains power (i.e., via the ground and/or neutral wire) and to be grounded via the ground bar 112, which may be the same or a different grounding system.

The ground bar 112 can also be connected to a grounding and/or neutral system in the server room. This can include being connected to a ground or neutral bus bar in a circuit breaker box for the server room, for example, being connected directly to ground rods driven into the ground, or connected to the ground and/or neutral of the mains power connection for the server room. The ground bar 112 can improve grounding and reduce noise, among other things for the components mounted in the improved cabinet system 100.

As shown in FIG. 2A, a convention server room can comprise a plurality of server racks 202, which are generally arranged in rows with access to the front and back of the racks 202. As mentioned above, the components in the racks 202 tend to consume a great deal of electricity and generate a lot of heat. As a result, server rooms often include false floors 204. The false floors 204 enable power and communications cables to be routed under the floor 206. In addition, the false floors 204 can include air conditioning (A/C) units 208 and/or ductwork 210 to enable cold air to be blown up through vents 212 in the floor 206.

Figure 2B:
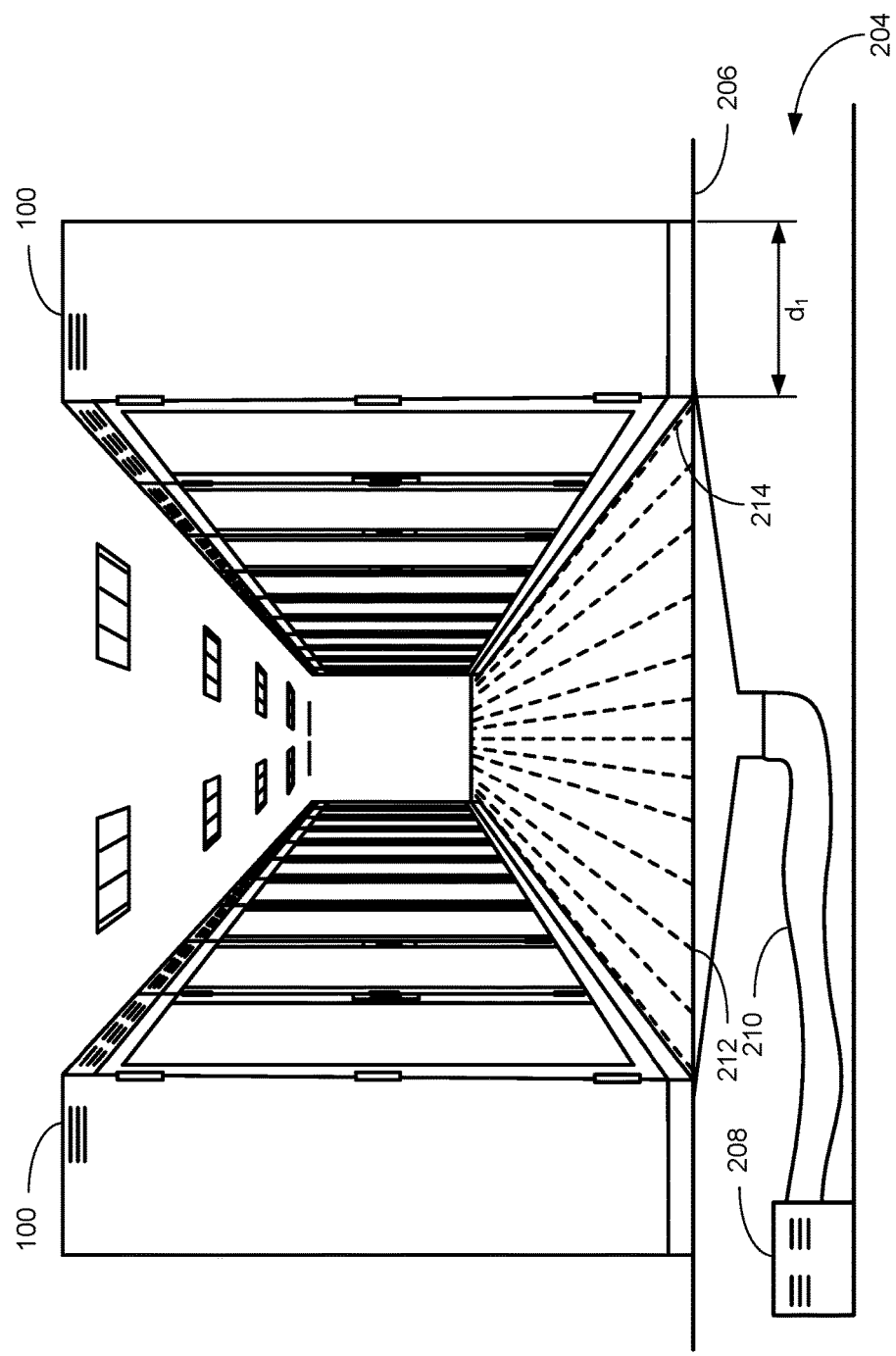
FIG. 2B is a perspective view of the conventional server room 200 of FIG. 2A with a plurality of improved electronic device cabinets, in accordance with some examples of the present disclosure.

Because the racks 202 tend to be a standard 48" outside depth, $d_2$, conventional server room 200*s* tend to be configured with this in mind. As shown in FIG. 2A, therefore, the vents 212 tend to be configured for 48" deep racks 202. As shown in FIG. 2B, however, the improved cabinet system 100 has an increased depth (e.g., 48" on the inside or greater), $d_2$, when compared to conventional racks 202. As a result, the front edge 214 of the improved cabinet system 100 hangs over the vent 212 in a conventional server room 200. At the least, this blocks airflow through the vent 212. This can also increase the temperature in the server room 200, for example, and may increase temperatures in the improved cabinet system 100 itself.

Figure 3:
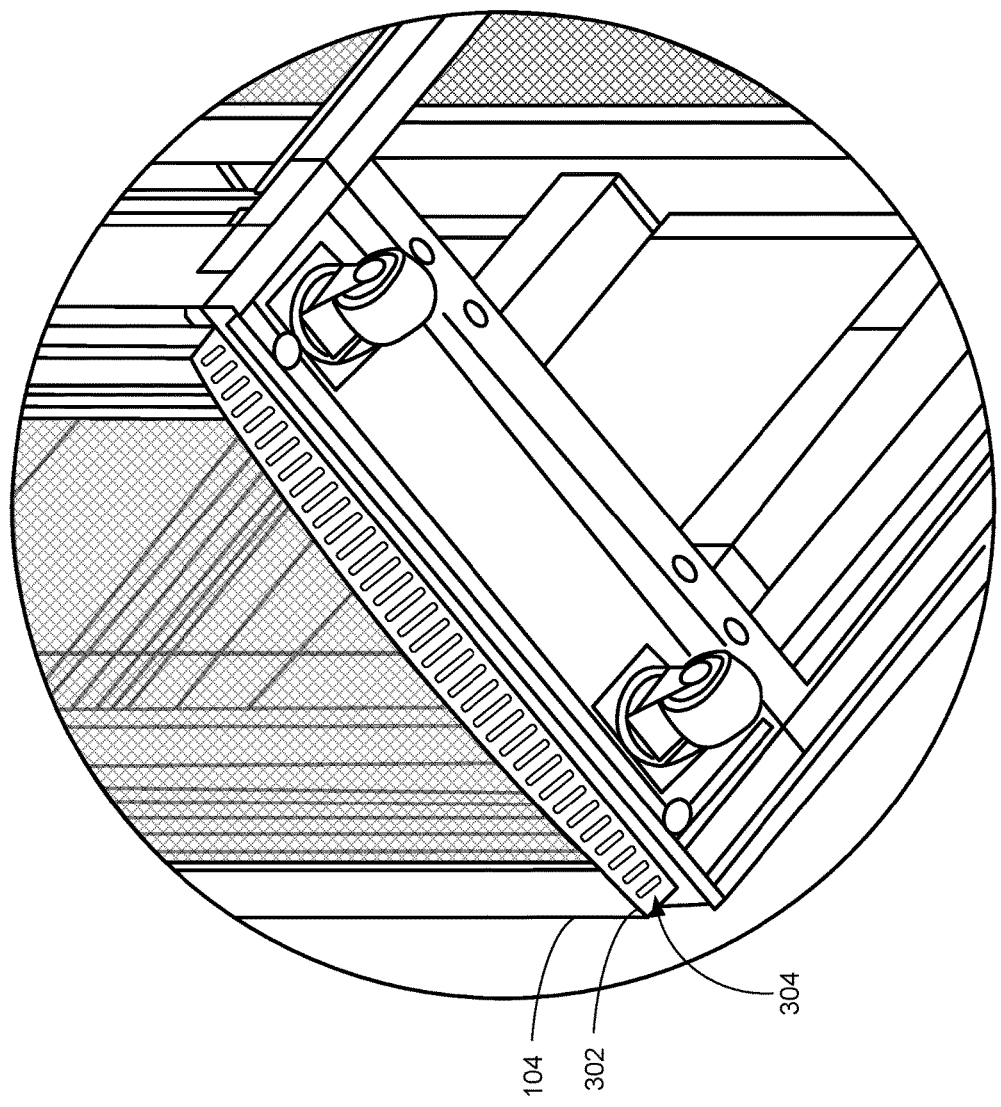
FIG. 3 is a bottom, detailed perspective view of the improved electronic device cabinet, in accordance with some examples of the present disclosure.
Figure 4:
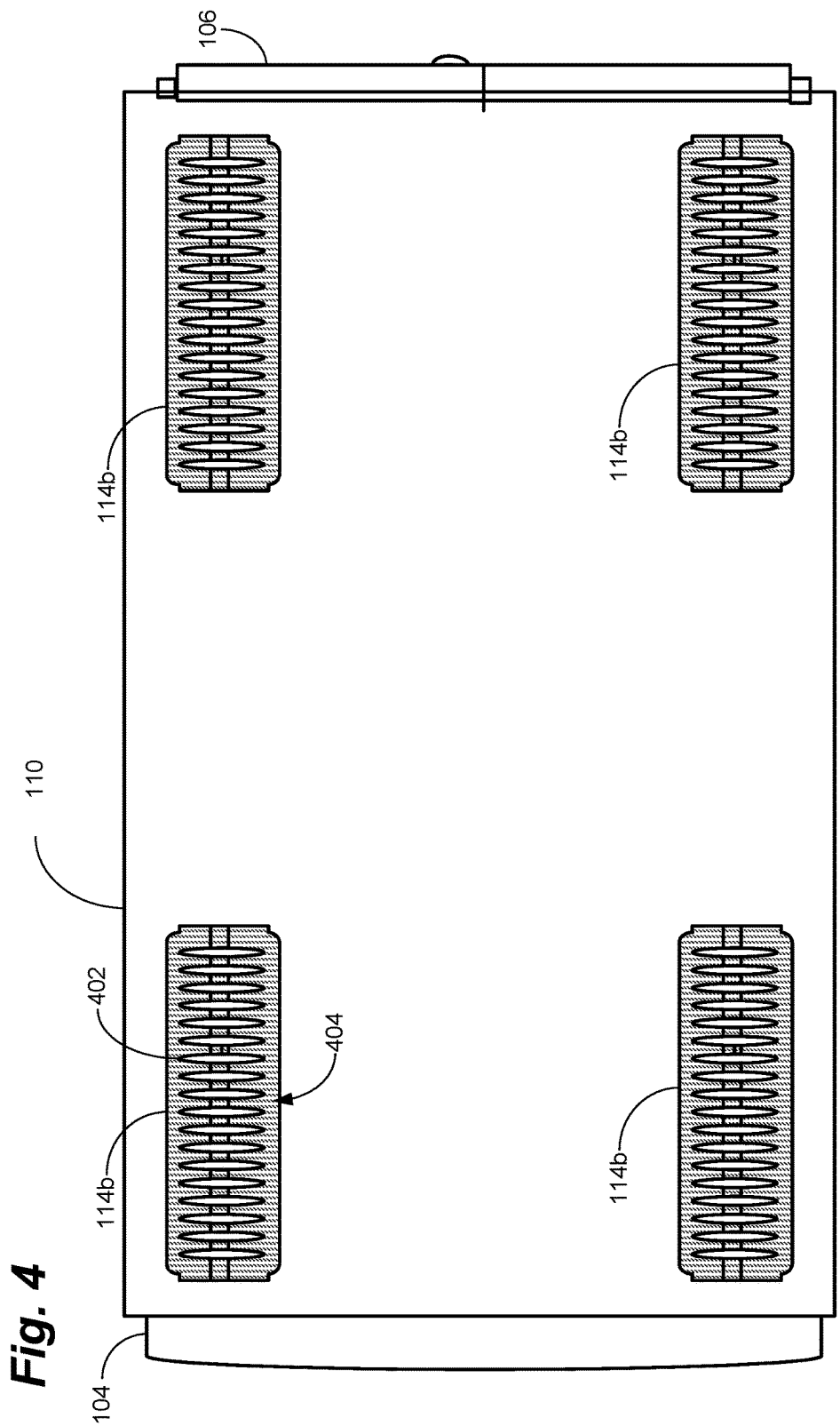
FIG. 4 is a top view of the improved electronic device cabinet, in accordance with some examples of the present disclosure.

To this end, as shown in FIG. 3, in some examples, the front door panel 104 can include a plurality of vents 302 along the bottom edge 304 of the front door panel 104. In this manner, the air from the vents 212 can be directed directly into the improved cabinet system 100. This can increase cooling inside the improved cabinet system 100 and, indeed, in the server room 200 itself. In other words, rather than blocking airflow completely or causing turbulent airflow as the air bounces off of the improved cabinet system 100, the air can flow relatively unimpeded into the improved cabinet system 100. This obviously cools the components inside the improved cabinet system 100, but may also lower overall server room 200 temperatures simply through the increased cooling efficiency provided.

As mentioned above, in some examples, the top panel 110 can include one or more top pass-throughs 114*a*. The pass-throughs can enable cables to be run into and out of the improved cabinet system 100 via the top panel 110. In some examples, the pass-throughs 114*b* can include a framework 402 and a plurality of bristles 404. The framework 402 can provide structure to the side pass-through 114b and can support the bristles 404. The bristles 404, on the other hand, can enable cables to pass through the top panel 110, while minimizing airflow into, and out of, the improved cabinet system 100.

This can improve cooling inside the improved cabinet system 100 by routing air in designated patterns. In other words, the improved cabinet system 100 can be designed to direct airflow over certain components (e.g., components with greater cooling requirements) first, and then to other components. The pass-throughs 114 can enable designers to manage airflow in the improved cabinet system 100 with minimal leakage through unwanted apertures.

As mentioned above, providing top pass-throughs 114a in the top panel 110 also enables cable runs to be shorter for certain components. Components located in the top of one improved cabinet system 100, for example, may need to be connected to similarly located components on another improved cabinet system 100. In a conventional rack 202, however, the cable would be required to run from the first component, all the way down the inside of a first rack 202, over to a second rack 202, and then all the way up the inside of the second rack 202 to the second component.

Using the side pass-throughs 114b in the top panel 110, on the other hand, enables the cable run to be considerably shorter. Compared to a conventional rack 202, the cable routed through the improved cabinet system 100 could be 10 feet, or more, shorter. With respect to signal speed and clarity for certain types of transmissions, this distance can be significant. Indeed, some cables have a maximum length, for example, beyond which they are no longer guaranteed to perform at their rated level of transmission performance.

Figure 5:
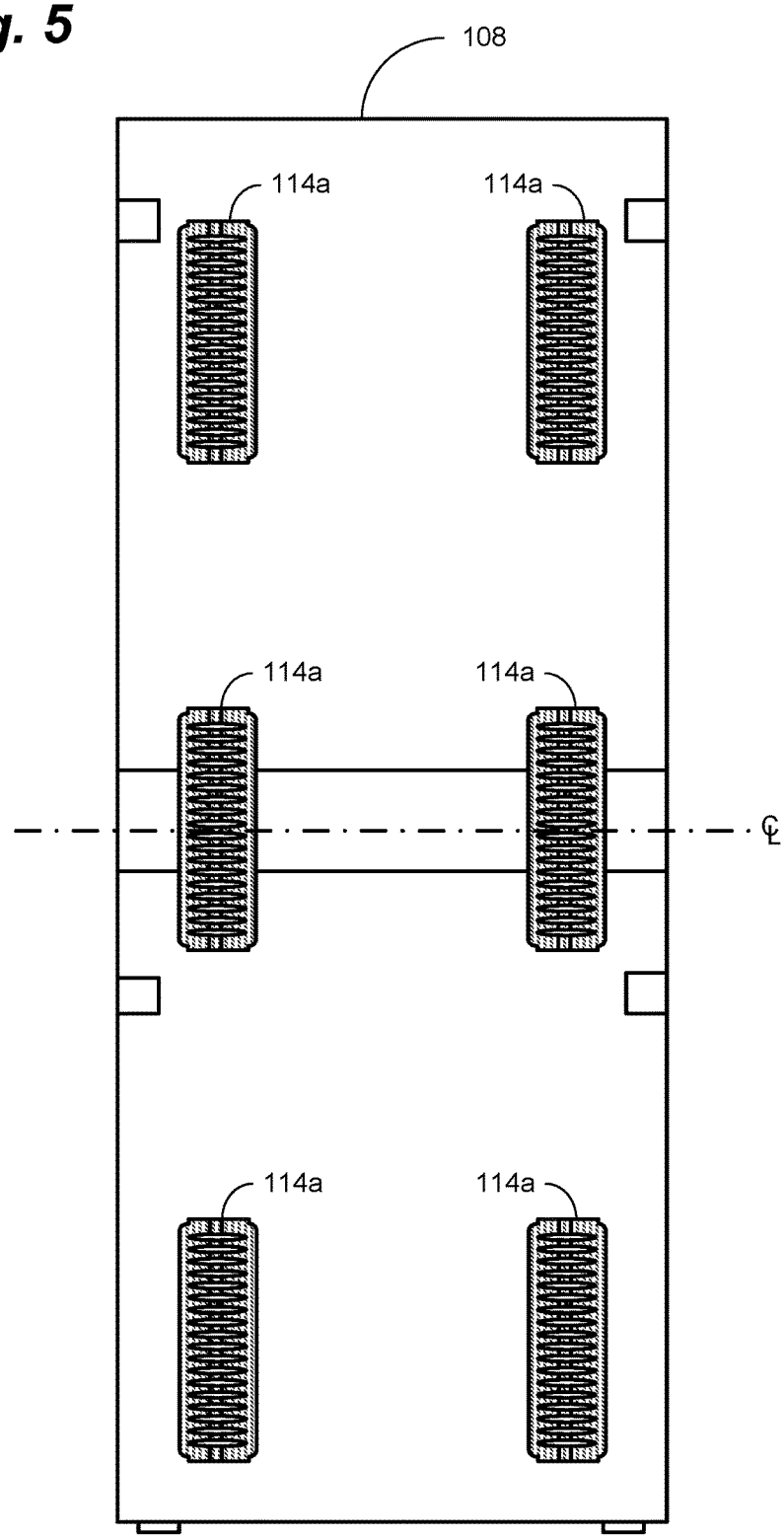
FIG. 5 is a side view of the improved electronic device cabinet, in accordance with some examples of the present disclosure.

Similarly, as shown in FIG. 5, in some examples, the side panels 108 can also include one or more side pass-throughs 114b. In some examples, the side panel 108 may include side pass-throughs 114b only in a median location 502 (e.g. with the side pass-through 114b centered within an inch or two of the middle of the side panel 108 height wise). In other words, components located in the top or bottom portion of the improved cabinet system 100 can be connected using the pass-throughs 114 in the top panel 110 or bottom panel 120 and components located in the middle can be connected via the side pass-throughs 114b. This may reduce manufacturing costs, for example, and parts complexity.

In other examples, to shorten the length of cable runs further, however, the side panel 108 can include additional side pass-throughs 114b located above and/or below the side pass-through 114b in the median location 502. This can enable components with similar rack locations to be connected with very short cables. Indeed, components located in the same location in two adjacent improved cabinet systems 100 may be connected with cables as short as 18".

Examples of the present disclosure, therefore, relate to an improved cabinet system 100 to house electronic components in a server room, computer room, or other facility. The improved cabinet system 100 provides improved cooling and cable routing, among other things. The improved cabinet system 100 is compatible with conventional server rooms 200, discussed above, with no modification to the server room 200 itself, despite changes in configuration to the improved cabinet system 100 when compared to conventional server racks 202.

While several possible examples are disclosed above, examples of the present disclosure are not so limited. For instance, while an improved cabinet system 100 for use with various electronic equipment has been disclosed, the system could be used on electronic equipment not mentioned, or other types of equipment without departing from the spirit of the disclosure. In addition, the location and configuration used for various features of examples of the present disclosure such as, for example, the pass-throughs or the configuration or location of the various panels 104, 106, 108, 110, for example, can be varied according to a particular server room that requires a slight variation due to, for example, the type and location of the server room, power or backup constraints, or accessibility concerns. Such changes are intended to be embraced within the scope of this disclosure.

The specific configurations and the size and shape of various elements can be varied according to particular design specifications or constraints requiring a device or system constructed according to the principles of this disclosure. Such changes are intended to be embraced within the scope of this disclosure. The presently disclosed examples, therefore, are considered in all respects to be illustrative and not restrictive. The scope of the disclosure is indicated by the appended claims, rather than the foregoing description, and all changes that come within the meaning and range of equivalents thereof are intended to be embraced therein.

What is claimed is:

1. A cabinet system comprising:
   a main frame comprising a plurality of rack units (RUs), each RU configured to mount one or more electronic components;
   a front door hingeably coupled to a front portion of the main frame;
   one or more side panels, each of the one or more side panels comprising at least one side pass-through to enable one or more cables to pass through the one or more side panels from an interior of the main frame to an exterior of the main frame, or vice-versa; and
   a top panel detachably coupled to a top portion of the main frame to enclose a top portion of the main frame.

2. The system of claim 1, the top panel comprising at least one top pass-through to enable one or more cables to pass through the top panel from the interior of the main frame to the exterior of the main frame, or vice-versa.

3. The system of claim 1, the front door comprising a plurality of vents disposed on a bottom leading edge of the front door.

4. The system of claim 1, further comprising a dedicated ground bar disposed proximate the plurality of RUs to provide a ground path to one or more electronic components mounted in the RUs.

5. The system of claim 1, wherein the at least one side pass-through in the side panel is disposed in a median location on the side panel.

6. The system of claim 5, the side panel further comprising at least one additional side pass through disposed above or below the side pass-through in the median location.

7. The system of claim 1, wherein the main frame is between 48" and 52" deep.

8. A system comprising:
   a first main frame housing a first plurality of electronic components and comprising:
      a first main frame comprising a plurality of rack units (RUs), each RU configured to mount one or more electronic components;
      a first front door hingeably coupled to a front portion of the first main frame;
      a first side panel comprising a first sider pass-through to enable one or more cables to pass through the first side panel from an interior of the first main frame to an exterior of the first main frame, or vice-versa; and a first top panel detachably coupled to a top portion of the first main frame to enclose a top portion of the first main frame; and a second main frame housing a second plurality of electronic components and comprising:
  a second main frame comprising a plurality of rack units (RUs), each RU configured to mount one or more electronic components;
  a second front door hingeably coupled to a front portion of the second main frame;
  a second side panel comprising a second side pass-through to enable one or more cables to pass through the second side panel from an interior of the second main frame to an exterior of the second main frame, or vice-versa; and
  a second top panel detachably coupled to a top portion of the second main frame to enclose a top portion of the second main frame;
  wherein the first side pass-through and the second side pass through enable a component in the first main frame and a component in the second main frame to be connected with a cable run through the first side panel and the second side panel.

9. The system of claim 8, the first top panel comprising a first top pass through to enable one or more cables to pass through the first top panel from the interior of the first main frame to the exterior of the first main frame, or vice-versa; and
  the second top panel comprising a second top pass through to enable one or more cables to pass through the second top panel from the interior of the second main frame to the exterior of the second main frame, or vice-versa;
  wherein the first top pass through and the second top pass through enable a component in the first main frame and a component in the second main frame to be connected with a cable run through the first top panel and the second top panel.

10. The system of claim 8, the first front door and second front door each comprising a plurality of vents disposed on a bottom leading edge of the first front door and the second front door, respectively.

11. The system of claim 8, the first main frame and the second main frame each further comprising a dedicated ground bar disposed proximate the plurality of RUs to provide a ground path to one or more electronic components mounted in the RUs.

12. The system of claim 8, wherein the first side pass-through in the first side panel is disposed in a median location on the first side panel; and
  wherein the first side pass-through in the second side panel is disposed above or below the median location on the second side panel.

13. The system of claim 12, the first side panel further comprising at least one additional side pass through disposed above or below the first side pass-through in the median location.

14. The system of claim 8, wherein the first main frame is between 48" and 52" deep.

15. A method comprising:
  installing a first cabinet system in a server room;
  installing a second cabinet system in the server room;
  installing a first plurality of electronic components in a first main frame of the first cabinet system;
  installing a second plurality of electronic components in a second main frame of the second cabinet system;
  routing a first cable through a first top pass through in a first top panel out of the first main frame of the first cabinet system;
  routing the first cable through a second top pass through in a second top panel into the second main frame of the second cabinet system;
  connecting a first electronic component of the first plurality of electronic components to a second electronic component of the second plurality of electronic components with the first cable;
  wherein the first electronic component is located in a top location in the first main frame; and
  wherein the second electronic component is located in a top location in the second main frame.

16. The method of claim 15, further comprising:
  connecting a third electronic component of the first plurality of electronic components to a fourth electronic component of the second plurality of electronic components with a second cable routed through a first side pass through in a first side panel out of the first main frame and through a second side pass through in a second side panel into the second main frame;
  wherein the first electronic component and the second electronic component are located within five rack units of each other in their respective main frames; and
  wherein the first side panel and the second side panel are disposed adjacent to each other.

17. The method of claim 15, further comprising:
  electrically connecting the first electronic component to a dedicated ground bar disposed inside the first cabinet system.

18. The method of claim 15, wherein installing a first cabinet system in the server room comprises installing the first cabinet system in at least a partially overlapping manner with a cooling vent disposed in a floor of the server room;
  wherein a front door of the first main frame comprises a plurality of vents on a bottom leading edge to direct air from the vent into the first main frame.

* * * * *